US009748371B2

(12) United States Patent
Radosavljevic et al.

(10) Patent No.: US 9,748,371 B2
(45) Date of Patent: Aug. 29, 2017

(54) TRANSITION METAL DICHALCOGENIDE SEMICONDUCTOR ASSEMBLIES

(71) Applicant: Intel Corporation, Santa Clara, CA (US)

(72) Inventors: Marko Radosavljevic, Portland, OR (US); Brian S. Doyle, Portland, OR (US); Ravi Pillarisetty, Portland, OR (US); Niloy Mukherjee, Portland, OR (US); Sansaptak Dasgupta, Hillsboro, OR (US); Han Wui Then, Portland, OR (US); Robert S. Chau, Beaverton, OR (US)

(73) Assignee: INTEL CORPORATION, Santa Clara, CA (US)

( * ) Notice: Subject to any disclaimer, the term of this patent is extended or adjusted under 35 U.S.C. 154(b) by 0 days.

(21) Appl. No.: 15/120,496

(22) PCT Filed: Mar. 21, 2014

(86) PCT No.: PCT/US2014/031496
§ 371 (c)(1),
(2) Date: Aug. 19, 2016

(87) PCT Pub. No.: WO2015/142358
PCT Pub. Date: Sep. 24, 2015

(65) Prior Publication Data
US 2017/0012117 A1 Jan. 12, 2017

(51) Int. Cl.
H01L 29/778 (2006.01)
H01L 29/786 (2006.01)
(Continued)

(52) U.S. Cl.
CPC .... *H01L 29/7782* (2013.01); *H01L 21/02422* (2013.01); *H01L 21/02568* (2013.01);
(Continued)

(58) Field of Classification Search
CPC ............... H01L 29/24; H01L 29/66969; H01L 29/78696; H01L 21/02568; H01L 29/78681; H01L 29/778; H01L 21/02527
See application file for complete search history.

(56) References Cited

U.S. PATENT DOCUMENTS

2007/0181938 A1  8/2007  Bucher et al.
2009/0146141 A1  6/2009  Song et al.
(Continued)

FOREIGN PATENT DOCUMENTS

KR    101348059 B1    1/2014
WO    2012093360 A1    7/2012

OTHER PUBLICATIONS

International Search Report and Written Opinion mailed Dec. 11, 2014, issued in corresponding International Application No. PCT/US2014/031496, 10 pages.
(Continued)

*Primary Examiner* — Jaehwan Oh
(74) *Attorney, Agent, or Firm* — Schwabe, Williamson & Wyatt, P.C.

(57) ABSTRACT

Embodiments of semiconductor assemblies, and related integrated circuit devices and techniques, are disclosed herein. In some embodiments, a semiconductor assembly may include a flexible substrate, a first barrier formed of a first transition metal dichalcogenide (TMD) material, a transistor channel formed of a second TMD material, and a second barrier formed of a third TMD material. The first barrier may be disposed between the transistor channel and the flexible substrate, the transistor channel may be disposed between the second barrier and the first barrier, and a bandgap of the transistor channel may be less than a bandgap of the first barrier and less than a bandgap of the second barrier. Other embodiments may be disclosed and/or claimed.

22 Claims, 6 Drawing Sheets

(51) Int. Cl.

| | |
|---|---|
| *H01L 29/24* | (2006.01) |
| *H01L 21/02* | (2006.01) |
| *H01L 21/8256* | (2006.01) |
| *H01L 27/12* | (2006.01) |
| *H01L 29/66* | (2006.01) |
| *H01L 29/08* | (2006.01) |

(52) U.S. Cl.
CPC ........ *H01L 21/8256* (2013.01); *H01L 27/124* (2013.01); *H01L 27/1225* (2013.01); *H01L 29/24* (2013.01); *H01L 29/66969* (2013.01); *H01L 29/786* (2013.01); *H01L 29/0843* (2013.01)

(56) References Cited

U.S. PATENT DOCUMENTS

| | | | |
|---|---|---|---|
| 2013/0105824 A1 | 5/2013 | Paranjape et al. | |
| 2015/0303315 A1* | 10/2015 | Das | H01L 29/78681 257/347 |
| 2016/0093491 A1* | 3/2016 | Choi | H01L 21/02485 438/151 |
| 2017/0015599 A1* | 1/2017 | Bessonov | C04B 41/80 |

OTHER PUBLICATIONS

Taiwan Office Action mailed mailed Jul. 26, 2016, issued in corresponding Taiwan Patent Application No. 104104565.
International Preliminary Report on Patentability mailed Oct. 6, 2016, issued in corresponding International Application No. PCT/US2014/031496, 7 pages.

* cited by examiner

TRANSITION METAL DICHALCOGENIDE SEMICONDUCTOR ASSEMBLIES

CROSS-REFERENCE TO RELATED APPLICATION

The present application is a national phase entry under 35 U.S.C. §371 of International Application No. PCT/US2014/031496, filed Mar. 21, 2014, entitled "TRANSITION METAL DICHALCOGENIDE SEMICONDUCTOR ASSEMBLIES," which designates the United States of America, the entire disclosure of which is hereby incorporated by reference in its entirety and all purposes.

TECHNICAL FIELD

The present disclosure relates generally to the field of semiconductor devices, and more particularly, to semiconductor assemblies with transition metal dichalcogenide (TMD) materials.

BACKGROUND

Some attempts have been made to develop flexible electronic circuits for use in wearables and other devices. In these devices, flexibility has typically been obtained at the expense of electrical performance. In particular, because the substrates used in existing flexible electronic circuits are unable to withstand high processing temperatures, only semiconductor materials with low processing temperatures have been used; because these materials typically have lower performance than materials with high processing temperatures, electrical performance of flexible electronic circuits has been limited.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example, and not by way of limitation, in the figures of the accompanying drawings.

DETAILED DESCRIPTION

Figure 1:
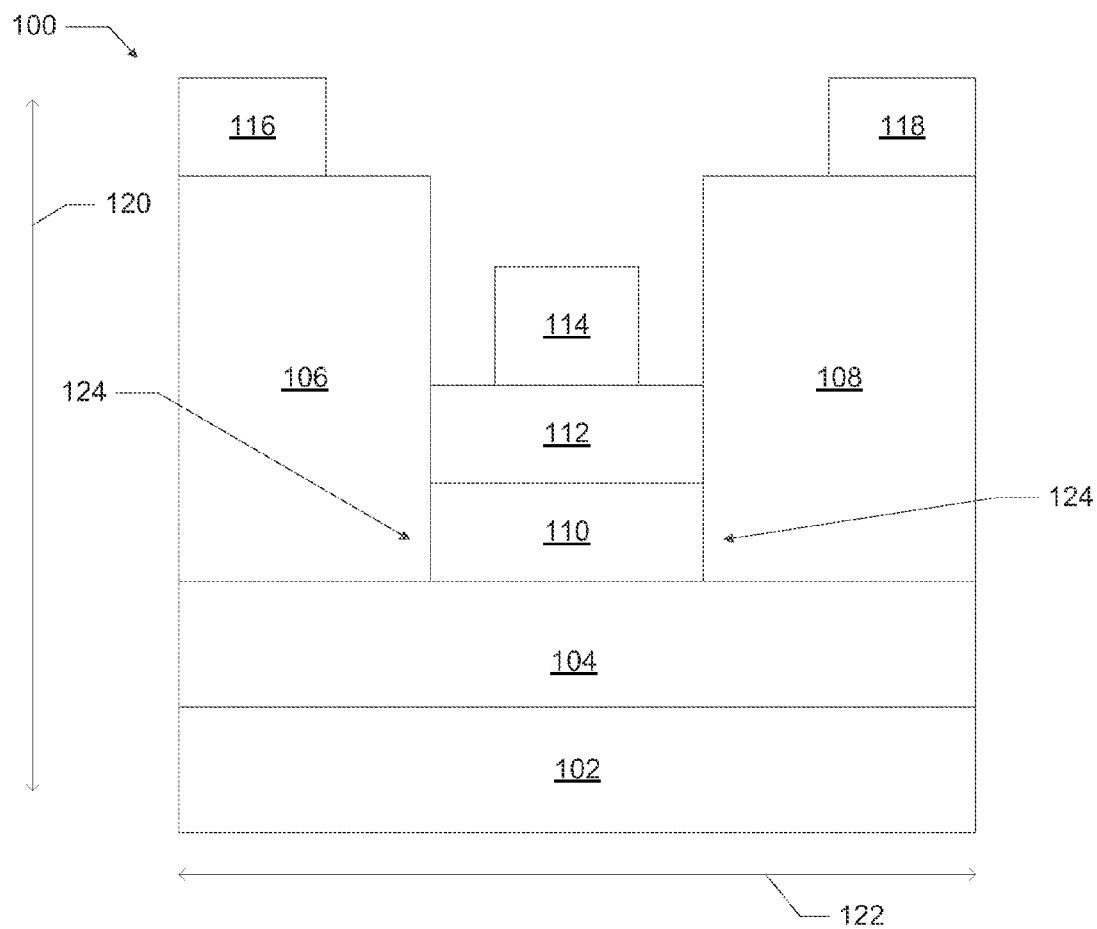
FIG. 1 is cross-sectional view of a semiconductor assembly including one or more transition metal dichalcogenide (TMD) materials, in accordance with various embodiments.

Embodiments of semiconductor assemblies, and related integrated circuit devices and techniques, are disclosed herein. In some embodiments, a semiconductor assembly may include a flexible substrate, a first barrier formed of a first transition metal dichalcogenide (TMD) material, a transistor channel formed of a second TMD material, and a second barrier formed of a third TMD material. The first barrier may be disposed between the transistor channel and the flexible substrate, the transistor channel may be disposed between the second barrier and the first barrier, and a bandgap of the transistor channel may be less than a bandgap of the first barrier and less than a bandgap of the second barrier.

The semiconductor assemblies and related techniques disclosed herein may enable the formation of transistor device layers on flexible substrates with improved performance properties over existing flexible substrate integrated circuit (IC) devices. In particular, the semiconductor assemblies disclosed herein may use TMD materials, which are compounds of a transition metal and sulfur, selenium, or tellurium. TMD materials may take the form of two-dimensional layers of molecules weakly bonded between layers via physical bonds (e.g., van der Waal's forces) to form a three-dimensional structure. In some embodiments, a semiconductor assembly may predominantly or wholly be formed of TMD materials.

Various embodiments of TMD materials may provide a number of advantages over conventional semiconductor materials. First, a conventional three-dimensional material may be constrained by strong chemical bonds (e.g., covalent around bonds) between molecules in a layer and between layers, and therefore must absorb the distortion forces both within a layer and between layers. Thus, such materials may be brittle; if the chemical bonding constraints are violated, a conventional three-dimensional material may fail. By contrast, when a TMD material is physically distorted (e.g., by bending), the two-dimensional layers may readily adjust the weak bonds between layers to respond to the distortion (e.g., by moving and sliding). Consequently, various embodiments of TMD materials may be more resilient to physical distortion, and therefore may be more appropriate for use with flexible substrates.

Additionally, when conventional three-dimensional materials are thinned so as to reduce the number of layers (and consequently, the number of layers of chemical bond constraints), the thinning may disrupt the crystal structure of the three-dimensional material and may create dangling bonds. These dangling bonds may exhibit a high recombination rate and thereby deplete local regions of minority carriers and impede the electrical performance of the thinned three-dimensional material. By contrast, because various embodiments of TMD materials may be "true" two-dimensional materials (with no chemical bonds between layers), electrical performance of TMD materials may not suffer from dangling bond-related depletion.

The interlayer chemical bonding constraints of conventional three-dimensional materials may also limit the range of substrates that may be used. In particular, since a layer of a conventional three-dimensional material seeks to chemically bond with molecules in the substrate, substrates must often be selected so as to have a lattice structure that approximately matches the lattice structure of the three-dimensional material. When these lattice structures fail to match, the three-dimensional material will be strained even before any applied physical distortion. For example, when a layer of germanium is applied to a silicon wafer, the bond lengths of the germanium may strain to match the bond lengths of the silicon. In such arrangements, subsequent physical distortion may cause the three-dimensional material to fail or have dramatic performance changes. The magnitude of this mismatch strain may increase as the thickness of the applied three-dimensional material decreases. Consequently, in conventional three-dimensional materials, the ability to stack these materials may be limited by the defects caused by bond length and lattice mismatches. However, because of the weak (non-chemical) interaction between two-dimensional layers of TMD materials, a two-dimensional layer of a TMD material may not seek to form matched bonds with the underlying substrate, and therefore TMD materials may be readily stacked on other materials having lattice structures different from the TMD material.

Because individual two-dimensional layers of a TMD material are weakly bonded with the other two-dimensional layers, it is possible to obtain and utilize a TMD material having a single-layer thickness. Various electrical properties of the TMD material, such as the bandgap of the TMD material, may be tuned by adjusting the number of layers of the TMD material. Additionally, because some TMD materials exhibit properties similar to a metal and some TMD materials exhibit (tunable) semiconducting properties, a wide variety of electronic structures may be built entirely or largely from various TMD materials (e.g., quantum wells). Thus, the performance advantages of TMD materials) may be applied to some or all components of various electronic devices. In particular, devices are described herein in which components other than or in addition to a transistor channel are formed from TMD materials. In some embodiments, remote doping techniques may improve the mobility of TMD materials used in channels of semiconductor assemblies. Remote doping techniques may provide carriers in a channel (e.g., in a quantum well) while putting impurities in the channel in a remote location, thereby removing the impurities from the channel. Since impurities tend to induce scattering of carriers, which decreases the carrier speed, remote doping may enable an increase in the mobility of carriers in the channel at higher doping levels.

Various embodiments of the semiconductor assemblies disclosed herein may also exhibit improved electrical performance over the organic or amorphous materials conventionally used with flexible substrates. For example, typical organic semiconductors typically have mobilities of approximately 0.1-1 centimeters squared per volt second. Various embodiments of the TMD materials included in the semiconductor assemblies disclosed herein may have mobilities of approximately 100 to 300 centimeters squared per volt second. These mobilities may be achieved for TMD materials having a single layer or a small number of layers; by contrast, very thin layers of silicon may have mobilities of less than 100 centimeters squared per volt second.

Although semiconductor assemblies with TMD materials are discussed principally herein, other two-dimensional materials may be used instead of or in addition to TMD materials. Examples of such materials include grapheme and boron nitride. The two-dimensional nature of these materials may provide some of the structural advantages discussed above with reference to the two-dimensional nature of TMD materials, and may exhibit various electrical or other properties that may make them appropriate for some applications. Thus, embodiments of the semiconductor assemblies disclosed herein may be formed with non-TMD two-dimensional materials.

In the following detailed description, reference is made to the accompanying drawings, which form a part hereof wherein like numerals designate like parts throughout, and in which is shown by way of illustration embodiments that may be practiced. It is to be understood that other embodiments may be utilized and structural or logical changes may be made without departing from the scope of the present disclosure. Therefore, the following detailed description is not to be taken in a limiting sense, and the scope of embodiments is defined by the appended claims and their equivalents.

Various operations may be described as multiple discrete actions or operations in turn, in a manner that is most helpful in understanding the claimed subject matter. However, the order of description should not be construed as to imply that these operations are necessarily order dependent. In particular, these operations may not be performed in the order of presentation. Operations described may be performed in a different order than the described embodiment. Various additional operations may be performed and/or described operations may be omitted in additional embodiments.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B and C).

The description uses the phrases "in an embodiment," or "in embodiments," which may each refer to one or more of the same or different embodiments. Furthermore, the terms "comprising," "including," "having," and the like, as used with respect to embodiments of the present disclosure, are synonymous.

FIG. 1 is a cross-sectional view of a semiconductor assembly 100 including one or more TMD materials, in accordance with various embodiments. The semiconductor assembly 100 may include a number of components, discussed below, one or more of which may be formed from a TMD material. In some embodiments, all of the conducting and semiconducting components of the semiconductor assembly 100 illustrated in FIG. 1 may be formed from a TMD material.

The particular structure of the semiconductor assembly 100 may be suitably used as a transistor, but the TMD material-based techniques and assemblies disclosed herein are not limited to transistors or to the particular transistor structure shown in FIG. 1, but may be used to form any suitable IC component (e.g., transistors having any suitable architecture, or IC components formed using conventional three-dimensional semiconductor materials).

The semiconductor assembly 100 may include a flexible substrate 102. In some embodiments, the flexible substrate 102 may be formed from a plastic material. The flexible substrate 102 may be formed from any flexible substrate material desirable for flexible electronic applications. For example, in some embodiments, the flexible substrate 102 may be formed from one or more of polyethylene terephthalate, polyethylene naphthalate, polycarbonate material, polyethersulfone material, polyimide material, or alkali-free borosilicate. In some embodiments, the flexible substrate 202 may be an amorphous material (e.g., one whose constituent molecules are not arranged regionally or wholly in a regular pattern). Although the use of flexible substrates may be advantageous in a number of applications, the TMD material-based techniques and assemblies disclosed herein need not include a flexible substrate (such as the flexible substrate 102), but may be formed on a rigid substrate (e.g., a conventional wafer substrate or any other substrate).

The semiconductor assembly 100 may include a barrier 104. In some embodiments, the barrier 104 may be disposed on the flexible substrate 102. The barrier 104 may be formed from a TMD material. TMD material suitable for use of the barrier 104 may include those TMD materials that have electronic characteristics of semiconductor materials. For example, the transistor channel 110 may be formed of molybdenum disulfide, molybdenum diselenide, molybdenum ditelluride, tungsten disulfide, tungsten diselenide, or tungsten ditelluride.

The semiconductor assembly 100 may include a transistor channel 110. In some embodiments, the barrier 104 may be disposed between the transistor channel 110 and the flexible substrate 102 in a direction 120. In some embodiments, the transistor channel 110 may be disposed on the barrier 104.

The transistor channel 110 may be formed from a TMD material. TMD material suitable for use of the transistor channel 110 may include those TMD materials that have electronic characteristics of semiconductor materials, such as those materials discussed above with reference to the barrier 104. In some embodiments, the transistor channel 110 may be a single layer of a TMD material. Single layers of TMD materials may have different electronic properties than multiple-layer (or "bulk") arrangements. In particular, the bandgap (e.g., the energy difference between the top of the valence band and the bottom of the conduction band) of single-layer TMD materials may be greater than the bandgap of multiple-layer TMD materials. For example, the bandgap of single-layer molybdenum disulfide may be 1.8 electron volts, while the bandgap of multiple-layer molybdenum disulfide may be 1.2 electron volts.

In some embodiments, the barrier 104 may be formed from a TMD material that has a bandgap that is greater than a bandgap of the transistor channel 110 (which may also be formed from a TMD material). A number of embodiments discussed herein will be discussed with reference to a pair of components having different bandgaps. Approximate bandgaps of various TMD materials are listed below in Table 1. In any embodiment in which two different components (e.g., two different components of the semiconductor assembly 100) are described as having different bandgaps, the components may be formed respectively of different materials from Table 1, selected so that the relative bandgaps are as desired. For example, if the barrier 104 is to be formed from a TMD material that has a bandgap that is greater than a bandgap of the transistor channel 110, the transistor channel 110 may be formed from single-layer molybdenum diselenide and the barrier 104 may be formed from single-layer molybdenum disulfide. Any combination of the materials listed in Table 1 is contemplated, with various combinations suitable for various applications (e.g., depending upon bandgap specifications).

TABLE 1

TMD materials and approximate bandgaps.

| Material | Approximate bandgap (electron volts) |
| --- | --- |
| Molybdenum ditelluride, bulk | 1.0 |
| Molybdenum ditelluride, single layer | 1.1 |
| Tungsten ditelluride, single layer | 1.1 |
| Molybdenum diselenide, bulk | 1.1 |
| Molybdenum disulfide, bulk | 1.2 |
| Tungsten diselenide, bulk | 1.2 |
| Tungsten disulfide, bulk | 1.4 |
| Molybdenum diselenide, single layer | 1.5 |
| Tungsten diselenide, single layer | 1.7 |
| Molybdenum disulfide, single layer | 1.8 |
| Tungsten disulfide, single layer | 1.9-2.1 |

The semiconductor assembly 100 may include a barrier 112. In some embodiments, the transistor channel 110 may be disposed between the barrier 112 and the barrier 104 in the direction 120. In some embodiments, the barrier 112 may be disposed on the transistor channel 110.

The barrier 112 may be formed from a TMD material. In some embodiments, the barrier 112 may be formed from a TMD material that has a bandgap that is greater than a bandgap of the transistor channel 110 (which may also be formed from a TMD material). Thus, in some embodiments, both the barrier 104 and the barrier 112 may have bandgaps that are greater than a bandgap of the transistor channel 110. In some embodiments, the barrier 104 and the barrier 112 may be formed of a same TMD material. In some embodiments, the barrier 104 and the barrier 112 may have approximately the same bandgap. In embodiments in which the barrier 112 is formed of a TMD material, the TMD material for the barrier 112 may be selected in accordance with any of the embodiments discussed above with reference to the barrier 104.

In some embodiments, the barrier 104, the transistor channel 110 and the barrier 112 may form a quantum well. The quantum well may be a potential well with only discrete energy values. Because the barrier 104 and the barrier 112 may have larger bandgaps than the transistor channel 110, mobile charges may "fall" from the barrier 104 and the barrier 112 into the transistor channel 110 (the lower energy state).

The semiconductor assembly 100 may include a transistor source 106 and a transistor drain 108. In some embodiments, the transistor channel 110 may be disposed between the transistor source 106 and the transistor drain 108 in a direction 122 (which may be perpendicular to the direction 120). In particular, the transistor channel 110 may be in contact with the transistor source 106 and the transistor drain 108 at the sides 124 so that current may flow through the transistor source 106, the transistor channel 110 and the transistor drain 108. In some embodiments, the barrier 112 may be disposed between the transistor source 106 and the transistor drain 108 in the direction 122. In some embodiments, the transistor source 106 and/or the transistor drain 108 may be disposed on the barrier 104. The transistor source 106 and/or the transistor drain 108 may be formed from a TMD material.

In some embodiments, the transistor source 106 and the transistor drain 108 may be formed of a same TMD material. TMD materials suitable for use as the transistor source 106 and/or the transistor drain 108 may include those TMD materials that have electronic characteristics of semiconductor materials (e.g., those materials discussed above with reference to the transistor channel 110). In some embodiments, the transistor source 106 and the transistor drain 108 may have approximately the same bandgap.

In some embodiments, the transistor source 106 and/or the transistor drain 108 may be formed from TMD materials that have bandgaps that are less than a bandgap of the barrier 112 and also less than a bandgap of the barrier 104. In some embodiments, the transistor source 106 and/or the transistor drain 108 may be formed from TMD materials that have bandgaps that are greater than a bandgap of the transistor channel 110. In some such embodiments, the transistor source 106 and/or the transistor drain 108 may be formed from a multiple-layer TMD material while the transistor channel 110 may be formed from a single-layer version of the same TMD material. For example, the transistor channel 110 may be formed of single-layer molybdenum diselenide, molybdenum disulfide, molybdenum ditelluride, tungsten disulfide, or tungsten diselenide, and the transistor source 106 and the transistor drain 108 may be formed from multiple-layer molybdenum diselenide, molybdenum disulfide, molybdenum ditelluride, tungsten disulfide or tungsten diselenide, respectively. By using smaller bandgap materials for the transistor source 106 (and/or the transistor drain 108), the contact resistance between the transistor source 106 (and/or the transistor drain 108) and any conductive contacts (e.g., the conductive contacts 116 and 118 discussed below) may be reduced, thereby reducing electrical losses as signals flow through the interface between the conductive contacts and the transistor source 106 (and/or the transistor drain 108).

In some embodiments, the bandgaps of the barrier 104 and the barrier 112 may be greater than the bandgaps of the transistor source 106 and the transistor drain 108, and the bandgaps of the transistor source 106 and the transistor drain 108 may be greater than the bandgap of the transistor channel 110. In such embodiments, mobile charges may "fall" from the barrier 104, the barrier 112, the transistor source 106 and the transistor drain 108 into the transistor channel 110 (the lower energy state). For example, the barriers 104 and 112 may be formed of multiple-layer molybdenum disulfide, the transistor source 106 and drain 108 may be formed from multiple-layer molybdenum diselenide, and the transistor channel 110 may be formed from single-layer molybdenum diselenide. In some embodiments, the transistor source 106 and/or the transistor drain 108 may not be formed of a TMD material (and instead, e.g., may be formed of another semiconductor material).

The semiconductor assembly 100 may include a source conductive contact 116 and a drain conductive contact 118. The transistor source 106 may be disposed between the source conductive contact 116 and the barrier 104 in the direction 120. The transistor drain 108 may be disposed between the drain conductive contact 118 and the barrier 104 in the direction 120. The source conductive contact 116 may be disposed on the transistor source 106. The drain conductive contact 118 may be disposed on the transistor drain 108. In use, current may flow between the source conductive contact 116, the transistor source 106, the transistor channel 110, the transistor drain 108 and the drain conductive contact 118.

In some embodiments, the source conductive contact 116 and the drain conductive contact 118 may be formed of a same TMD material. TMD materials suitable for use as the source conductive contact 116 and/or the drain conductive contact 118 may include those TMD materials that have electronic characteristics substantially similar to those of metals. For example, the source conductive contact 116 and/or the drain conductive contact 118 may be formed of niobium disulfide, niobium diselenide, niobium ditelluride, tantalum disulfide, tantalum diselenide, and/or tantalum ditelluride. In some embodiments, the source conductive contact 116 and/or the drain conductive contact 118 may not be formed of a TMD material (and instead, e.g., may be formed of a metal or other conductive material).

The semiconductor assembly 100 may include a gate conductive contact 114. Voltage applied to the gate conductive contact 114 may regulate the amount of current flow between the source conductive contact 116 and the drain conductive contact 118 (via the transistor channel 110). The barrier 112 may be disposed between the gate conductive contact 114 and the transistor channel 110 in the direction 120. In some embodiments, the gate conductive contact may be disposed on the barrier 112. In some embodiments, the gate conductive contact 114 may be disposed between the transistor source 106 and the transistor drain 108 in the direction 122. In some embodiments, the gate conductive contact 114 may be disposed between the source conductive contact 116 and the drain conductive contact 118 in the direction 122. The gate conductive contact 114 may be formed of any of the materials discussed above with reference to the source conductive contact 116 and the drain conductive contact 118, for example.

FIGS. 2-7 are side views of various stages in a process for manufacturing the semiconductor assembly 100, in accordance with various embodiments. In these stages, a number of materials (e.g., TMD materials) are described as deposited. Various deposition techniques may be used as suitable at any of these stages. For example, in some embodiments, a tape method may be used to deposit TMD material (e.g., the TMD material of the transistor channel 110 or any of the other components of the semiconductor assembly 100). In a tape method, an adhesive tape may be attached to a bulk formation of the desired TMD material (e.g., a three-dimensional formation including multiple two-dimensional layers of TMD material weakly bonded between layers). The strength of the adhesive may be selected so that, when the tape is peeled away from the bulk formation, the interlayer bonding strength may be over, and a desired number of layers of the TMD material may be removed with the tape. The desired number of layers of the TMD material may then be applied to the surface on which they are to be deposited, and a solvent may be used to dissolve the tape away.

Figure 2:
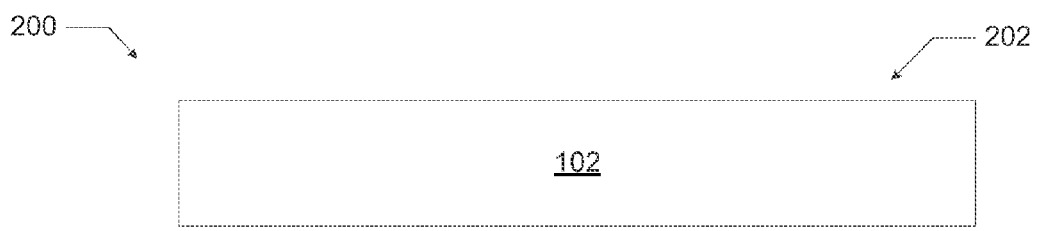
FIGS. 2-7 are side views of various stages in a process for manufacturing the semiconductor assembly of FIG. 1, in accordance with various embodiments.

FIG. 2 depicts an assembly 200 formed after a flexible substrate 102 is provided. The flexible substrate 102 may take the form of any of the corresponding embodiments discussed above with reference to FIG. 1. For example, in some embodiments, the flexible substrate 102 may be a plastic material. The flexible substrate 102 may have an exposed surface 202.

Figure 3:
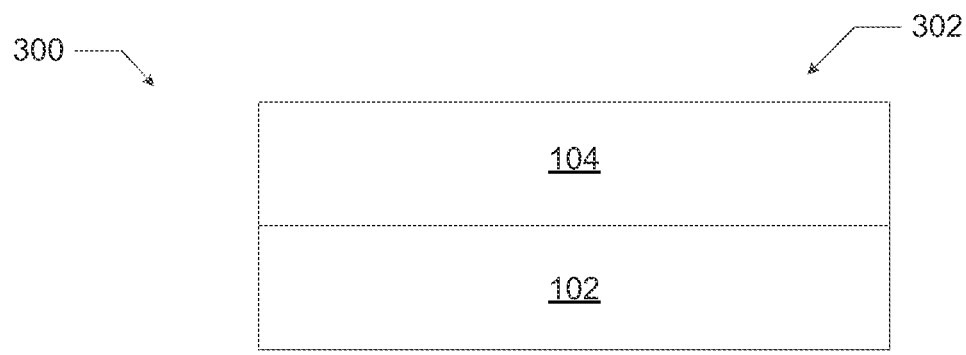

FIG. 3 depicts an assembly 300 formed after a material is deposited on the surface 202 of the flexible substrate 102 to form a barrier 104. The barrier 104 may take the form of any of the corresponding embodiments discussed above with reference to FIG. 1. The barrier 104 may have an exposed surface 302.

Figure 4:
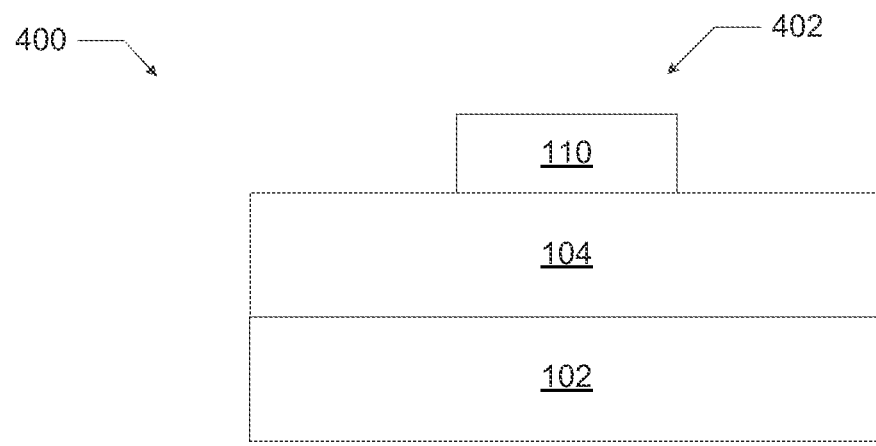

FIG. 4 depicts an assembly 400 formed after a material is deposited on the surface 302 of the barrier 104 to form a transistor channel 110. The transistor channel 110 may take the form of any of the corresponding embodiments discussed above with reference to FIG. 1. The transistor channel 110 may have an exposed surface 402.

Figure 5:
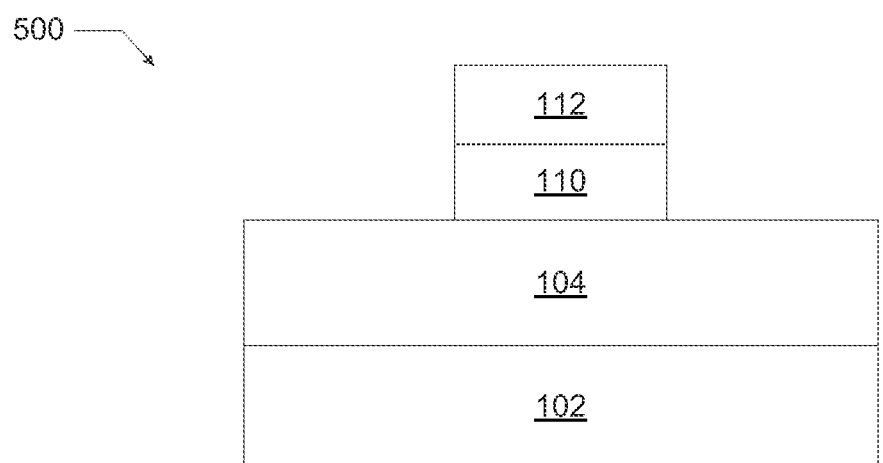

FIG. 5 depicts an assembly 500 formed after a material is deposited on the surface 402 of the transistor channel 110 to form a barrier 112. The barrier 112 may take the form of any of the corresponding embodiments discussed above with reference to FIG. 1.

Figure 6:
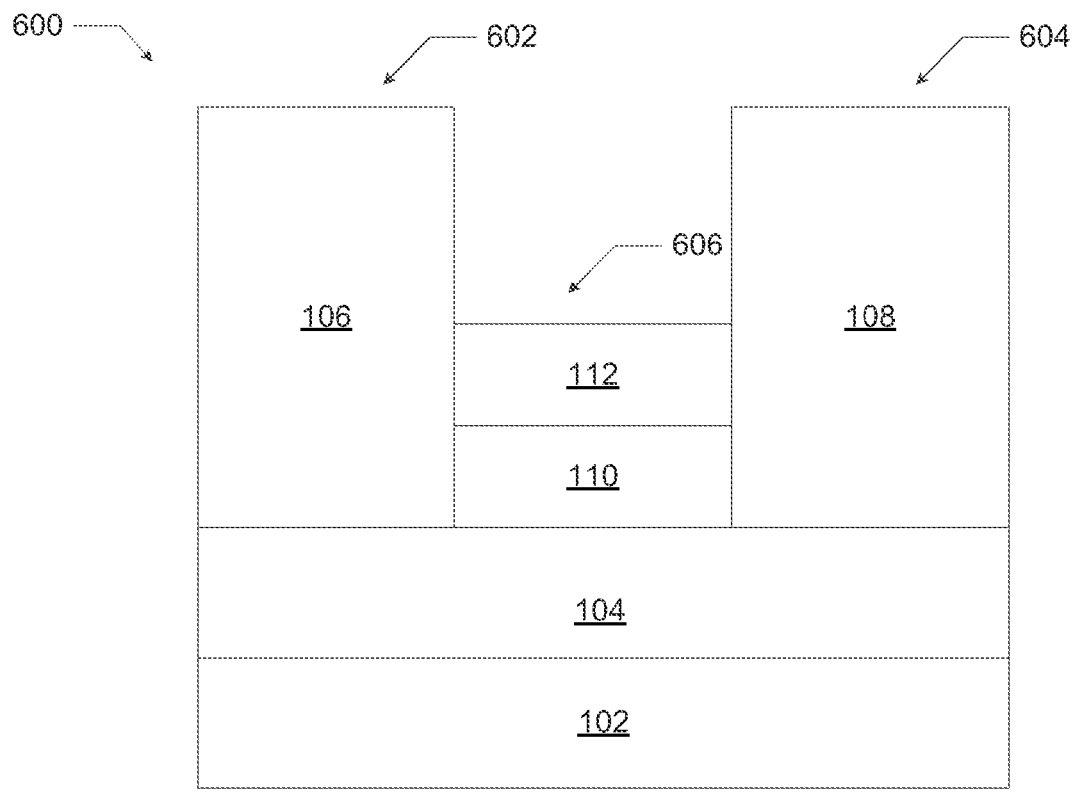

FIG. 6 depicts an assembly 600 formed after a material is deposited on the surface 302 of the barrier 104 to form a transistor source 106, and after material is deposited on the surface 302 of the barrier 104 to form a transistor drain 108. The transistor source 106 and the transistor drain 108 may take the form of any of the corresponding embodiments discussed above with reference to FIG. 1. The transistor source 106 may have an exposed surface 602, the transistor drain 108 may have an exposed surface 604 and the barrier 112 may have an exposed surface 606.

Figure 7:
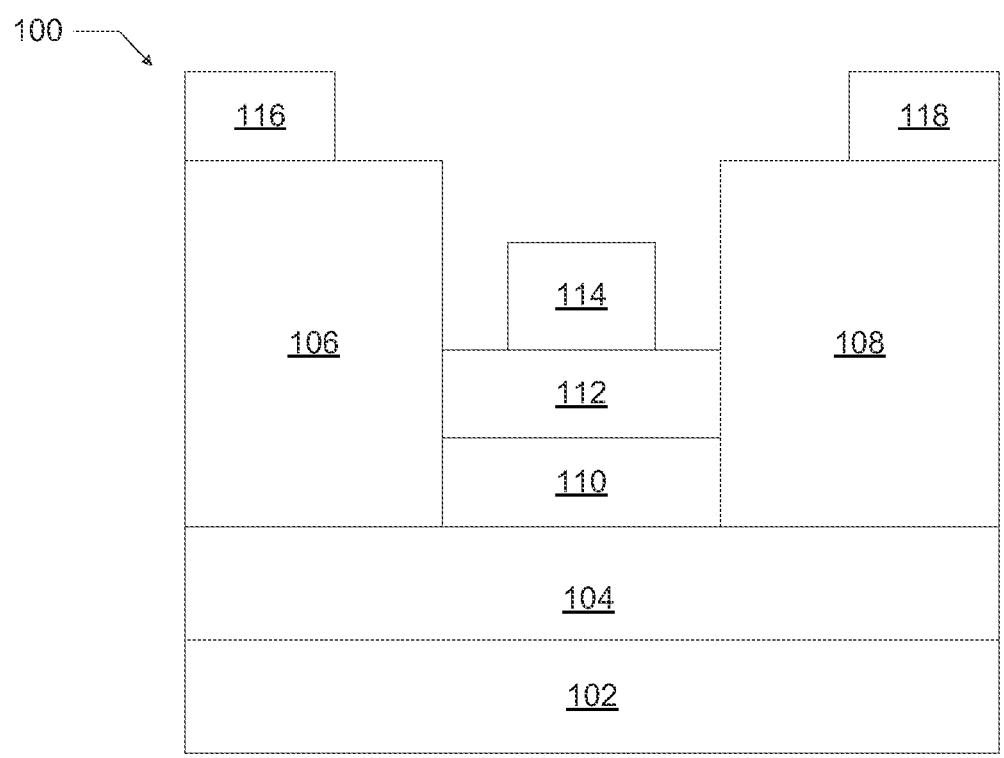

FIG. 7 depicts the semiconductor assembly 100 formed after a material is deposited on the surface 602 of the transistor source 106 to form the source conductive contact 116, after material is deposited on the surface 604 of the transistor drain 108 to form the drain conductive contact 118, and after material is deposited on the surface 606 of the barrier 112 to form the gate conductive contact 114. The source conductive contact 116, the drain conductive contact 118 and the gate conductive contact 114 may take the form of any of the corresponding embodiments discussed above with reference to FIG. 1.

The semiconductor assemblies disclosed herein (such as the semiconductor assembly 100) may be used in a device layer in electrical and/or optical circuit devices. Various devices, such as transistors, may be formed using TMD materials in a manner analogous to conventional semiconductor circuit manufacture techniques (e.g., those performed on silicon or other semiconductor wafers) and may be included in otherwise conventional IC circuitry. For example, the semiconductor assembly 100 may be included in a device layer of an IC device (e.g., as discussed below with reference to FIG. 8). In embodiments in which the semiconductor assembly 100 includes a flexible substrate 102, the semiconductor assembly 200 may be able to bend and otherwise to form in a manner not achievable by conventional rigid substrates (such as silicon wafers). Thus, the range of applications of certain of the semiconductor assemblies disclosed herein may be broader than the range of applications of conventional rigid circuits.

The semiconductor assemblies may provide improved performance at smaller scales as compared to assemblies with conventional materials. For example, as the lateral dimensions e.g., the direction 122) of transistor devices decrease, transistor channels must typically be made center in order to mitigate problematic short channel effects. However, as discussed above, single layers of conventional materials may exhibit mechanical and electrical performance weaknesses. However, due to the "true" two-dimensional nature of the layers of TMD materials, single-layer TMD materials may be achieved. Such materials may have a thickness on the order of one nanometer, and may represent a minimum achievable thickness for transistor channels. Such single-layer TMD materials (and other TMD materials with small numbers of layers) may provide both physical performance and electrical performance improvements over thin layers of conventional semiconductor materials.

Figure 8:
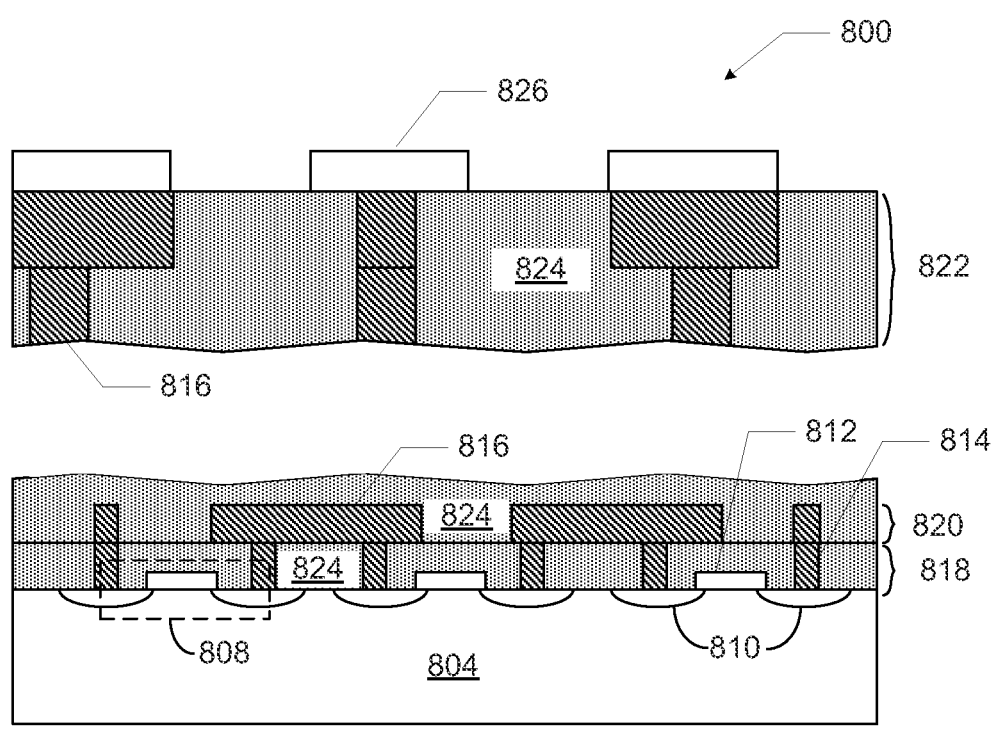
FIG. 8 is a cross-sectional view of a portion of an integrated circuit (IC) device, which may include one or more of the semiconductor assemblies disclosed herein, in accordance with some embodiments.

The semiconductor assemblies and related techniques disclosed herein may be included in an IC device. FIG. 8 is a cross-sectional view of a portion of an IC device 800 including a device layer 818 (which may include one or more of the semiconductor assemblies disclosed herein), in accordance with various embodiments. In some embodiments, the IC device 800 may be a die (which may be produced, e.g., in a batch of many dies on a substrate, then separated from other dies by cutting).

The IC device 800 may be formed on a substrate 804. The substrate 804 may include a flexible substrate material (such as the flexible substrate 102) or a rigid substrate material.

In some embodiments, the IC device 800 may include a device layer 818 disposed on the substrate 804. The device layer 818 may include channels providing features of one or more transistors 808 formed on the substrate 804. The device layer 818 may include, for example, one or more source and/or drain (S/D) 810, a gate 812 to control current flow in the transistor(s) 808 between the S/D regions 810, and one or more S/D contacts 814 to route electrical signals to/from the S/D regions 810. The transistor(s) 808 may include additional features not depicted for the sake of clarity, such as device isolation regions, gate contacts, and the like. In some embodiments, these features may be formed in accordance with any of the embodiments of these features discussed herein (e.g., with reference to FIG. 1). The transistor(s) 808 are not limited to the type and configuration depicted in FIGS. 1 and 8 and may include a wide variety of other types and configurations such as, for example, planar and non-planar transistors such as dual- or double-gate transistors, tri-gate transistors, and all-around gate (AAG) or wrap-around gate transistors, some of which may be referred to as FinFETs (Field Effect Transistors). In some embodiments, the device layer 818 may include one or more transistors or memory cells of a logic device or a memory device, or combinations thereof. In some embodiments, the device layer 818 may include optical devices. Some or all of the transistors or other devices included in the device layer 818 may be formed partially or entirely from TMD materials.

Electrical signals such as, for example, power and/or input/output (I/O) signals may be routed to and/or from the transistor(s) 808 of the device layer 818 through one or more interconnect layers 820 and 822 disposed on the device layer 818. For example, electrically conductive features of the device layer 818 such as, for example, the gate 812 and S/D contacts 814 may be electrically coupled with the interconnect structures 816 of the interconnect layers 820 and 822 (e.g., the source conductive contact 116, the gate conductive contact 114 and the drain conductive contact 118). The interconnect structures 816 may be configured within the interconnect layers 820 and 822 to route electrical signals according to a wide variety of designs and are not limited to the particular configuration of interconnect structures 816 depicted in FIG. 8. For example, in some embodiments, the interconnect structures 816 may include trench structures (sometimes referred to as "lines") and/or via structures (sometimes referred to as "holes") filled with an electrically conductive material such as a metal. In some embodiments, the interconnect structures 816 may comprise copper or another suitable electrically conductive material. In some embodiments, optical signals may be routed to and/or from the device layer 818 instead of or in addition to electrical signals.

The interconnect layers 820 and 822 may include the dielectric layer 824 disposed between the interconnect structures 816, as can be seen. In some embodiments, a first interconnect layer 820 (referred to as Metal 1 or "M1") may be formed directly on the device layer 818. In some embodiments, the first interconnect layer 820 may include some of the interconnect structures 816, which may be coupled with contacts (e.g., the S/D contacts 814) of the device layer 818.

Additional interconnect layers (not shown for ease of illustration) may be formed directly on the first interconnect layer 820 and may include interconnect structures 816 to couple with interconnect structures of the first interconnect layer 820.

The IC device 800 may have one or more bond pads 826 formed on the interconnect layers 820 and 822. The bond pads 826 may be electrically coupled with the interconnect structures 816 and configured to route the electrical signals of transistor(s) 808 to other external devices. For example, solder bonds may be formed on the one or more bond pads 826 to mechanically and/or electrically couple a chip including the IC device 800 with another component such as a circuit board. The IC device 800 may have other alternative configurations to route the signals from the interconnect layers 820 and 822 than depicted in other embodiments. In other embodiments, the bond pads 826 may be replaced by or may further include other analogous features (e.g., posts) that route the signals to other external components.

Figure 9:
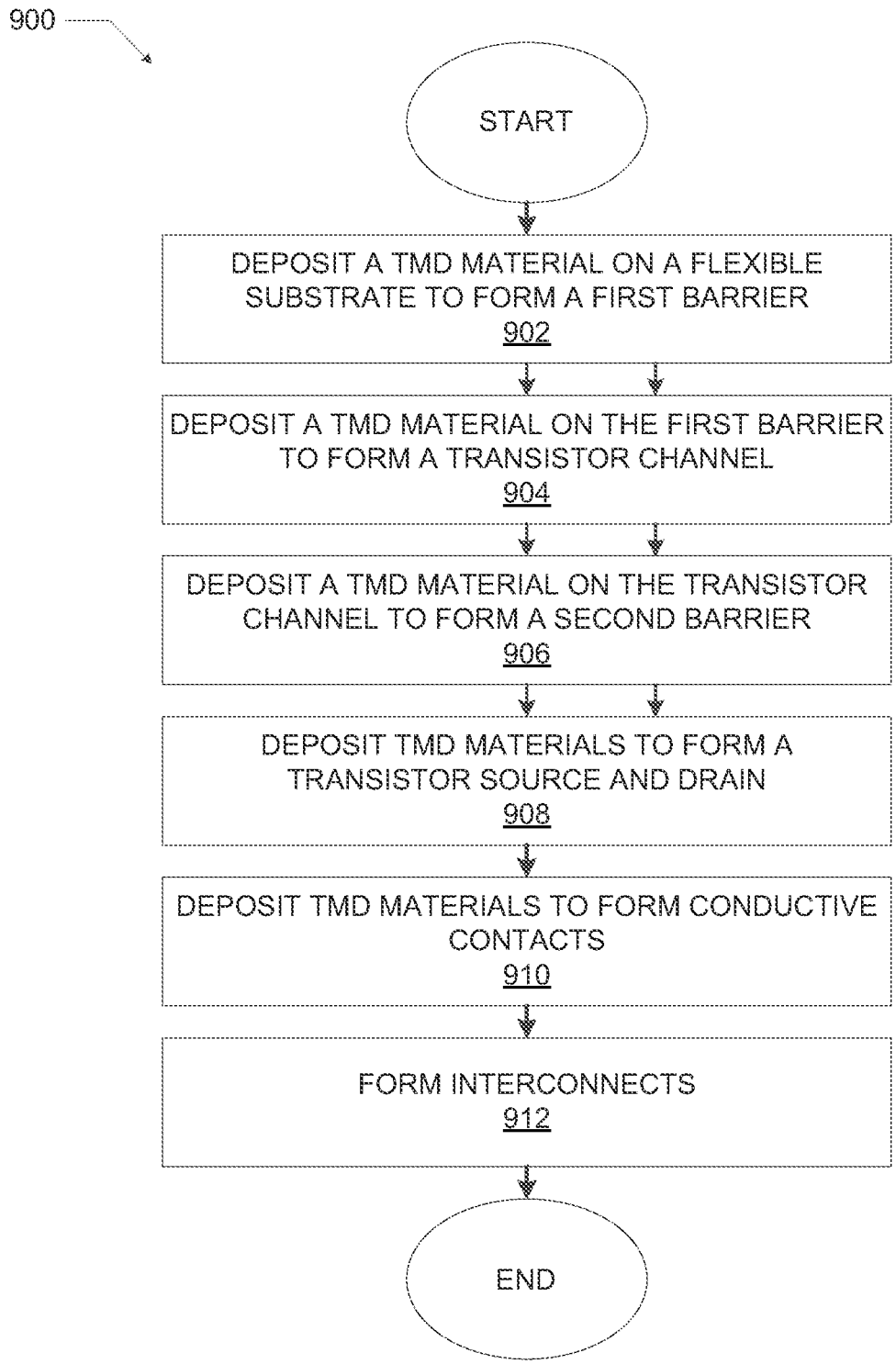
FIG. 9 is a flow diagram of an illustrative process for manufacturing an IC device including a semiconductor assembly with TMD materials, in accordance with various embodiments.

FIG. 9 is a flow diagram of a process 900 for forming an IC device including a semiconductor assembly with TMD materials, in accordance with various embodiments. In the discussion of the process 900 below, many deposited materials are described as being TMD materials. In some embodiments, one or more of the deposit materials may not be TMD materials, as desired, and may instead be conventional semiconductor and/or metal materials. The operations of the process 900 may be discussed below with reference to the semiconductor assembly 100 (FIG. 1), but this is simply for ease of illustration and the process 900 may be applied so as to form any suitable IC device. In some embodiments, the process 900 may be performed to manufacture an IC device included in the computing device 1000 discussed below with reference to FIG. 10. Various operations of the process 900 may be repeated, rearranged, or omitted as suitable.

At 902, a TMD material may be deposited on a flexible substrate to form a first barrier. The first barrier of 902 may take the form of any of the embodiments of the barrier 104, for example.

At 904, a TMD material may be deposited on the first barrier to form a transistor channel. The transistor channel of 904 may take the form of any of the embodiments of the transistor channel 110, for example. The transistor channel of 904 may be formed such that the first barrier of 902 is disposed between the transistor channel of 904 and the flexible substrate of 902. In some embodiments, a bandgap of the first barrier of 902 may be greater than a bandgap of the transistor channel of 904.

At 906, a TMD material may be deposited on the transistor channel to form a second barrier. The second barrier of 906 may take the form of any of the embodiments of the barrier 112, for example. The second barrier of 906 may be formed such that the transistor channel of 904 is disposed between the second barrier of 906 and the first barrier of 902. In some embodiments, a bandgap of the second barrier of 906 may be greater than a bandgap of the transistor channel of 904.

At 908, TMD materials may be deposited on the first barrier of 904 to form a transistor source and a transistor drain. The transistor source and the transistor drain of 908 may take the form of any of the embodiments of the transistor source 106 and the transistor drain 108, respectively, for example. The transistor source and the transistor drain of 908 may be disposed so as to be in contact with opposite sides of the transistor channel of 904 (e.g., as shown in FIG. 1).

At 910, TMD materials may be deposited on the transistor source and the transistor drain of 908 and the second barrier of 906 to form a source conductive contact, a drain conductive contact and a gate conductive contact, respectively. The source conductive contact, the drain conductive contact and the gate conductive contact of 910 may take the form of any of the embodiments of the source conductive contact 116, the drain conductive contact 118 and the gate conductive contact 114, respectively, for example. In some embodiments, the semiconductor assembly 100 may be formed upon the completion of 910.

At 912, one or more interconnects may be formed to route signals to and/or from the semiconductor assembly 100. The interconnects formed at 912 may route electrical, optical and/or any other suitable signals to and/or from the semiconductor assembly 100. The interconnects formed at 912 may take the form of the interconnect structures 816 discussed above with reference to FIG. 8, for example. The process 900 may then end.

As noted above, in some embodiments, one or more of the operations of the process 900 illustrated in FIG. 9 may be omitted. For example, in some embodiments, the operations of 908-912 may not be performed. In some embodiments, the operations of 912 may be performed by an entity different from an entity that performs the operations of 902-910.

Figure 10:
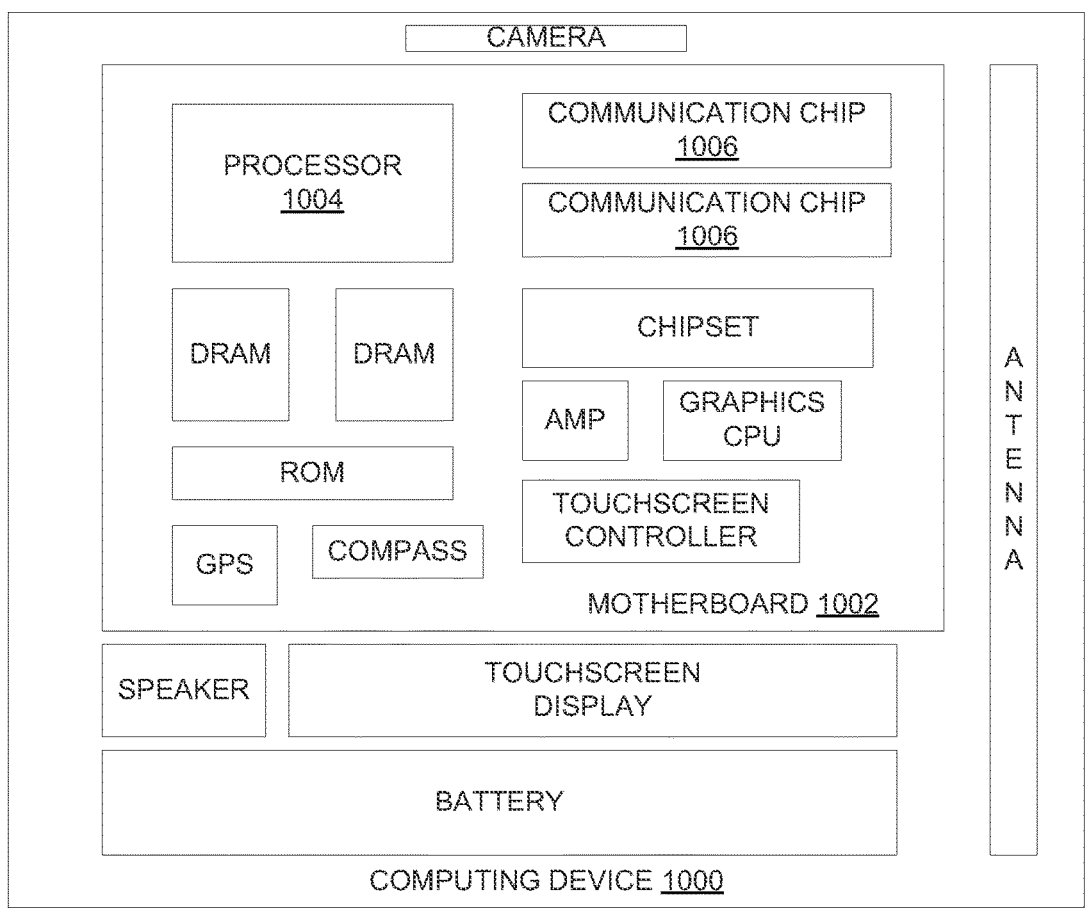
FIG. 10 schematically illustrates a computing device that may include one or more semiconductor assemblies disclosed herein, in accordance with various embodiments.

FIG. 10 schematically illustrates a computing device 1000 that may include one or more of the semiconductor assemblies 100 disclosed herein, in accordance with various embodiments. In particular, substrates of any suitable ones of the components of the computing device 1000 may include the semiconductor assemblies 100 disclosed herein.

The computing device 1000 may house a board such as motherboard 1002. The motherboard 1002 may include a number of components, including but not limited to a processor 1004 and at least one communication chip 1006. The processor 1004 may be physically and electrically coupled to the motherboard 1002. In some implementations, the at least one communication chip 1006 may also be physically and electrically coupled to the motherboard 1002. In further implementations, the communication chip 1006 may be part of the processor 1004. The term "processor" may refer to any device or portion of a device that processes electronic data from registers and/or memory to transform that electronic data into other electronic data that may be stored in registers and/or memory.

Depending on its applications, computing device 1000 may include other components that may or may not be physically and electrically coupled to the motherboard 1002. These other components may include, but are not limited to, volatile memory (e.g., dynamic random access memory), non-volatile memory (e.g., read-only memory), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, a Geiger counter, an accelerometer, a gyroscope, a speaker, a camera, and a mass storage device (such as hard disk drive, compact disk (CD), digital versatile disk (DVD), and so forth).

The communication chip 1006 may enable wireless communications for the transfer of data to and from the computing device 1000. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 1006 may implement any of a number of wireless standards or protocols, including but not limited to Institute for Electrical and Electronic Engineers (IEEE) standards including Wi-Fi (IEEE 802.11 family), IEEE 802.16 standards (e.g., IEEE 802.16-2005 Amendment), Long-Term Evolution (LTE) project along with any amendments, updates, and/or revisions (e.g., advanced LTE project, ultra mobile broadband (UMB) project (also referred to as 3GPP2), etc.). IEEE 802.16 compatible Broadband Wireless Access (BWA) networks are generally referred to as WiMAX networks, an acronym that stands for Worldwide Interoperability for Microwave Access, which is a certification mark for products that pass conformity and interoperability tests for the IEEE 802.16 standards. The communication chip 1006 may operate in accordance with a Global System for Mobile Communication (GSM), General Packet Radio Service (GPRS), Universal Mobile Telecommunications System (UMTS), High Speed Packet Access (HSPA), Evolved HSPA (E-HSPA), or LTE network. The communication chip 1006 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). The communication chip 1006 may operate in accordance with Code Division Multiple Access (CDMA), Time Division Multiple Access (TDMA), Digital Enhanced Cordless Telecommunications (DECT), Evolution-Data Optimized (EV-DO), derivatives thereof, as well as any other wireless protocols that are designated as 3G, 4G, 5G, and beyond. The communication chip 1006 may operate in accordance with other wireless protocols in other embodiments.

The computing device 1000 may include a plurality of communication chips 1006. For instance, a first communication chip 1006 may be dedicated to shorter range wireless communications such as Wi-Fi and Bluetooth and a second communication chip 1006 may be dedicated to longer range wireless communications such as GPS, EDGE, GPRS, CDMA, WiMAX, LTE, EV-DO, and others.

The communication chip 1006 may also include an IC package assembly that may include a semiconductor assembly as described herein. In further implementations, another component (e.g., memory device, processor or other integrated circuit device) housed within the computing device 1000 may contain a semiconductor assembly as described herein.

In various implementations, the computing device 1000 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 1000 may be any other electronic device that processes data. In some embodiments, the techniques described herein are implemented in a high-performance computing device. In some embodiments, the techniques described herein are implemented in handheld computing devices. In some embodiments, the techniques described herein may be implemented in a wearable computing device. In particular, the wearable computing device may include a flexible substrate (e.g., a rubber or other flexible wrist band) and one or more flexible circuit components constructed in accordance with various ones of the techniques disclosed herein.

The following paragraphs provide a number of examples of the embodiments disclosed herein. Example 1 is a semiconductor assembly, including: a flexible substrate; a first barrier formed of a first TMD material; a transistor channel formed of a second TMD material; and a second barrier formed of a third TMD material; wherein the first barrier is disposed between the transistor channel and the flexible substrate, the transistor channel is disposed between the second barrier and the first barrier, and a bandgap of the transistor channel is less than a bandgap of the first barrier and less than a bandgap of the second barrier.

Example 2 may include the subject matter of Example 1, and may further specify that the transistor channel formed of the second TMD material is a single layer of the second TMD material.

Example 3 may include the subject matter of any of Examples 1-2, and may further specify that: the first barrier is disposed between the transistor channel and the flexible substrate in a first direction; the transistor channel is disposed between the second barrier and the first barrier in the first direction; and the transistor channel is disposed between, in a second direction perpendicular to the first direction, a transistor source formed of a fourth TMD material and a transistor drain formed of a fifth TMD material.

Example 4 may include the subject matter of Example 3, and may further specify that the second barrier is disposed between the transistor source and the transistor drain in the second direction.

Example 5 may include the subject matter of any of Examples 3-4, and may further include: a source conductive contact formed of a sixth TMD material; and a drain conductive contact formed of a seventh TMD material; wherein the transistor source is disposed between the source conductive contact and the first barrier in the first direction, and the transistor drain is disposed between the drain conductive contact and the first barrier in the first direction.

Example 6 may include the subject matter of Example 5, and may further specify that the second barrier is disposed between the transistor source and the transistor drain in the second direction.

Example 7 may include the subject matter of any of Examples 5-6, and may further specify that the sixth TMD material and the seventh TMD material are a same TMD material.

Example 8 may include the subject matter of any of Examples 3-7, and may further specify that the transistor source is formed of multiple layers of the fourth TMD material and the transistor drain is formed of multiple layers of the fifth TMD material.

Example 9 may include the subject matter of any of Examples 3-8, and may further specify that the bandgaps of the first barrier and the second barrier are both greater than a bandgap of the transistor source and both greater than a bandgap of the transistor drain.

Example 10 may include the subject matter of any of Examples 3-9, and may further specify that the fourth TMD material and the fifth TMD material are a same TMD material.

Example 11 may include the subject matter of any of Examples 1-10, and may further include a gate conductive contact formed of a fourth TMD material, wherein the second barrier is disposed between the gate conductive contact and the transistor channel.

Example 12 may include the subject matter of any of Examples 1-11, and may further specify that the first TMD material and the third TMD material are a same TMD material.

Example 13 is a method of forming a semiconductor assembly, including: depositing a first TMD material on a first surface of a flexible substrate to form a first barrier; depositing a second TMD material on the first barrier to form a transistor channel; and depositing a third TMD material on the transistor channel to form a second barrier; wherein the first barrier is disposed between the transistor channel and the flexible substrate, the transistor channel is disposed between the second barrier and the first barrier, and a bandgap of the transistor channel is less than a bandgap of the first barrier and less than a bandgap of the second barrier.

Example 14 may include the subject matter of Example 13, and may further specify that the flexible substrate is a plastic substrate.

Example 15 may include the subject matter of any of Examples 13-14, and may further specify that depositing the second TMD material comprises using a tape method.

Example 16 may include the subject matter of any of Examples 13-15, and may further include depositing a fourth TMD material to form a gate conductive contact such that the second barrier is disposed between the gate conductive contact and the transistor channel.

Example 17 may include the subject matter of any of Examples 13-16, and may further specify that the first TMD material and the third TMD material are a same TMD material.

Example 18 is an IC device, including a device layer including: a flexible substrate, a first barrier formed of a first TMD material, a transistor channel formed of a second TMD material, a second barrier formed of a third TMD material, a transistor source formed of a fourth TMD material, and a transistor drain formed of a fifth TMD material, wherein the first barrier is disposed between the transistor channel and the flexible substrate in a first direction, the transistor channel is disposed between the second barrier and the first barrier in the first direction, a bandgap of the transistor channel is less than a bandgap of the first barrier and less than a bandgap of the second barrier, the transistor channel is disposed between the transistor source and the transistor drain formed in a second direction perpendicular to the first direction. The IC device may also include one or more interconnects to route electrical signals to and/or from the transistor source and the transistor drain.

Example 19 may include the subject matter of Example 18, and may further specify that the device layer further includes: a gate conductive contact formed of a sixth TMD material; a source conductive contact formed of a seventh TMD material; and a drain conductive contact formed of an eighth TMD material; wherein the second barrier is disposed between the gate conductive contact and the transistor channel in the first direction, the transistor source is disposed between the source conductive contact and the first barrier in the first direction, and the transistor drain is disposed between the drain conductive contact and the first barrier in the first direction.

Example 20 may include the subject matter of Example 19, and may further specify that the sixth TMD material, the seventh TMD material, and the eighth TMD material are a same TMD material.

Example 21 may include the subject matter of Example 20, and may further specify that the same TMD material is niobium disulfide, niobium diselenide, niobium ditelluride, tantalum disulfide, tantalum diselenide, or tantalum ditelluride.

Example 22 may include the subject matter of any of Examples 18-21, and may further specify that the IC device is a die.

What is claimed is:

1. A semiconductor assembly, comprising:
   a flexible substrate;
   a first barrier formed of a first transition metal dichalcogenide (TMD) material;
   a transistor channel formed of a second TMD material; and
   a second barrier formed of a third TMD material;
   wherein the first barrier is disposed between the transistor channel and the flexible substrate, the transistor channel is disposed between the second barrier and the first barrier, and a bandgap of the transistor channel is less than a bandgap of the first barrier and less than a bandgap of the second barrier.

2. The semiconductor assembly of claim 1, wherein the transistor channel formed of the second TMD material is a single layer of the second TMD material.

3. The semiconductor assembly of claim 1, wherein:
   the first barrier is disposed between the transistor channel and the flexible substrate in a first direction;
   the transistor channel is disposed between the second barrier and the first barrier in the first direction; and
   the transistor channel is disposed between, in a second direction perpendicular to the first direction, a transistor source formed of a fourth TMD material and a transistor drain formed of a fifth TMD material.

4. The semiconductor assembly of claim 3, wherein the second barrier is disposed between the transistor source and the transistor drain in the second direction.

5. The semiconductor assembly of claim 3, further comprising:
   a source conductive contact formed of a sixth TMD material; and
   a drain conductive contact formed of a seventh TMD material;
   wherein the transistor source is disposed between the source conductive contact and the first barrier in the first direction, and the transistor drain is disposed between the drain conductive contact and the first barrier in the first direction.

6. The semiconductor assembly of claim 5, wherein the second barrier is disposed between the transistor source and the transistor drain in the second direction.

7. The semiconductor assembly of claim 5, wherein the sixth TMD material and the seventh TMD material are a same TMD material.

8. The semiconductor assembly of claim 3, wherein the transistor source is formed of multiple layers of the fourth TMD material and the transistor drain is formed of multiple layers of the fifth TMD material.

9. The semiconductor assembly of claim 3, wherein the bandgaps of the first barrier and the second barrier are both greater than a bandgap of the transistor source and both greater than a bandgap of the transistor drain.

10. The semiconductor assembly of claim 3, wherein the fourth TMD material and the fifth TMD material are a same TMD material.

11. The semiconductor assembly of claim 1, further comprising:
    a gate conductive contact formed of a fourth TMD material;
    wherein the second barrier is disposed between the gate conductive contact and the transistor channel.

12. The semiconductor assembly of claim 1, wherein the first TMD material and the third TMD material are a same TMD material.

13. A method of forming a semiconductor assembly, comprising:
    depositing a first transition metal dichalcogenide (TMD) material on a first surface of a flexible substrate to form a first barrier;
    depositing a second TMD material on the first barrier to form a transistor channel; and
    depositing a third TMD material on the transistor channel to form a second barrier;
    wherein the first barrier is disposed between the transistor channel and the flexible substrate, the transistor channel is disposed between the second barrier and the first barrier, and a bandgap of the transistor channel is less than a bandgap of the first barrier and less than a bandgap of the second barrier.

14. The method of claim 13, wherein the flexible substrate is a plastic substrate.

15. The method of claim 13, wherein depositing the second TMD material comprises using a tape method.

16. The method of claim 13, further comprising:
depositing a fourth TMD material to form a gate conductive contact such that the second barrier is disposed between the gate conductive contact and the transistor channel.

17. The method of claim 13, wherein the first TMD material and the third TMD material are a same TMD material.

18. An integrated circuit (IC) device, comprising:
a device layer comprising:
  a flexible substrate,
  a first barrier formed of a first transition metal dichalcogenide (TMD) material,
  a transistor channel formed of a second TMD material,
  a second barrier formed of a third TMD material,
  a transistor source formed of a fourth TMD material, and
  a transistor drain formed of a fifth TMD material,
  wherein the first barrier is disposed between the transistor channel and the flexible substrate in a first direction, the transistor channel is disposed between the second barrier and the first barrier in the first direction, a bandgap of the transistor channel is less than a bandgap of the first barrier and less than a bandgap of the second barrier, the transistor channel is disposed between the transistor source and the transistor drain formed in a second direction perpendicular to the first direction; and
  one or more interconnects to route electrical signals to and/or from the transistor source and the transistor drain.

19. The IC device of claim 18, wherein the device layer further comprises:
  a gate conductive contact formed of a sixth TMD material;
  a source conductive contact formed of a seventh TMD material; and
  a drain conductive contact formed of an eighth TMD material;
  wherein the second barrier is disposed between the gate conductive contact and the transistor channel in the first direction, the transistor source is disposed between the source conductive contact and the first barrier in the first direction, and the transistor drain is disposed between the drain conductive contact and the first barrier in the first direction.

20. The IC device of claim 19, wherein the sixth TMD material, the seventh TMD material, and the eighth TMD material are a same TMD material.

21. The IC device of claim 20, wherein the same TMD material is niobium disulfide, niobium diselenide, niobium ditelluride, tantalum disulfide, tantalum diselenide, or tantalum ditelluride.

22. The IC device of claim 18, wherein the IC device is a die.

* * * * *